(12) United States Patent
Tokioka et al.

(10) Patent No.: US 8,994,410 B2
(45) Date of Patent: Mar. 31, 2015

(54) SEMICONDUCTOR DEVICE WITH POWER SUPPLY CIRCUIT

(71) Applicant: Renesas Electronics Corporation, Kawasaki-shi, Kanagawa (JP)

(72) Inventors: Yoshinori Tokioka, Kanagawa (JP); Kenji Tokami, Kanagawa (JP); Shintaro Mori, Kanagawa (JP); Shigeki Nakamura, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 14/037,347

(22) Filed: Sep. 25, 2013

(65) Prior Publication Data
US 2014/0084983 A1    Mar. 27, 2014

(30) Foreign Application Priority Data
Sep. 26, 2012    (JP) .................................. 2012-212443

(51) Int. Cl.
*H03B 1/00*    (2006.01)
*H03K 3/00*    (2006.01)
*H03K 5/08*    (2006.01)

(52) U.S. Cl.
CPC ..................................... *H03K 5/088* (2013.01)
USPC ........... 327/108; 327/109; 327/110; 327/112; 323/288

(58) Field of Classification Search
USPC ................... 327/108, 109, 110, 112; 323/288
See application file for complete search history.

(56) References Cited

U.S. PATENT DOCUMENTS

2010/0201336 A1*  8/2010  Chen et al. .................... 323/285

FOREIGN PATENT DOCUMENTS

JP    2003-330555 A    11/2003

* cited by examiner

*Primary Examiner* — John Poos
(74) *Attorney, Agent, or Firm* — Miles & Stockbridge P.C.

(57) ABSTRACT

The present invention is directed to prevent occurrence of a problem on a withstand voltage in a circuit group which receives supply of an internal power supply voltage. An error amplifier outputs a control voltage obtained by amplifying a difference voltage between a reference voltage and a divided voltage obtained by dividing an internal power supply voltage to an output node. A drive transistor supplies a drive current according to the control voltage of the output node of the error amplifier from an external power supply line to an internal power supply line. When the divided voltage exceeds a predetermined voltage, a clamp circuit changes the control voltage in the direction of decreasing the drive current.

6 Claims, 7 Drawing Sheets

SEMICONDUCTOR DEVICE WITH POWER SUPPLY CIRCUIT

CROSS-REFERENCE TO RELATED APPLICATIONS

The disclosure of Japanese Patent Application No. 2012-212443 filed on Sep. 26, 2012 including the specification, drawings and abstract is incorporated herein by reference in its entirety.

BACKGROUND

The present invention relates to a semiconductor device which is preferably used in, for example, a semiconductor integrated circuit device having a power supply circuit.

A semiconductor integrated circuit device having a power supply circuit is generally provided with a power supply circuit for generating a controlled internal power supply voltage by dropping a power supply voltage (external power supply voltage) supplied from the outside of the semiconductor device. Usually, a power supply circuit includes a drive transistor, a voltage dividing circuit, a reference voltage circuit, and an error amplifier. The drive transistor is coupled between a power supply line which receives the external power supply voltage and a power supply line which supplies the internal power supply voltage. The error amplifier controls a voltage to be applied to a control electrode (gate) of a control transistor in accordance with the difference voltage between a divided voltage of the internal power supply voltage, which is output from the voltage dividing circuit and a reference voltage which is output from the reference voltage circuit.

Patent literature 1 discloses a power supply circuit having a comparison circuit for comparing a reference voltage with an output voltage and a circuit for suppressing, to be within a predetermined range, a fluctuation in the output voltage with respect to a fluctuation in an external supply voltage. The circuit has a transistor which is current-mirror-coupled to a switch MOS (Metal Oxide Semiconductor) transistor for controlling the output voltage in the case where a fluctuation occurs in the external supply voltage, and controls the switch MOS transistor so as to follow the fluctuation in the external supply voltage.

RELATED ART LITERATURE

Patent Literature

Patent Literature 1: Japanese Unexamined Patent Publication No. 2003-330555

SUMMARY

In a semiconductor device, there is the possibility that the level of an external power supply voltage largely fluctuates. For example, in the case where the external power supply voltage is set to a voltage in a low-power-consumption mode, which is lower than that in a normal operation mode or in the case where an unintended fluctuation occurs in the external power supply voltage, the fluctuation in the voltage level as described above occurs.

In this case, there is the possibility that a drive current by a drive transistor changes due to an influence of the fluctuation in the external power supply voltage, thereby making an internal power supply voltage rise, and this state continues for a long time. When such a phenomenon occurs, a problem on a withstand voltage may occur in a circuit group receiving supply of the internal power supply voltage.

The other subjects and novel features will become apparent from the description of the specification and the appended drawings.

A semiconductor device as an embodiment includes a first power supply line, a second power supply line, a drive transistor, an error amplifier, and a clamp circuit. The first power supply line receives supply of a first DC voltage. The second power supply line transmits a second DC voltage lower than the first DC voltage. The drive transistor is coupled between the first and second power supply lines and supplies a drive current according to a voltage of a control electrode from the first power supply line to the second power supply line. The error amplifier changes the voltage of the control electrode toward either a first voltage in a direction of increasing the drive current or a second voltage in a direction of decreasing the drive current on the basis of a difference voltage between a reference voltage and the second DC voltage. The clamp circuit changes, when the second DC voltage exceeds a predetermined voltage higher than the reference voltage, the voltage of the control electrode toward the second voltage.

In the embodiment, by a clamp circuit, when the internal power supply voltage rises, the drive current of the drive transistor can be decreased. Therefore, the risen internal power supply voltage can be decreased more promptly than a feedback control of the error amplifier. As a result, occurrence of a problem on the withstand voltage in the circuit group receiving the supply of the internal power supply voltage can be prevented.

DETAILED DESCRIPTION

Hereinafter, embodiments will be described specifically with reference to the drawings. The same reference numerals are designated to the same or corresponding parts and their description will not be repeated.

Schematic Configuration of Semiconductor Device

Figure 1:
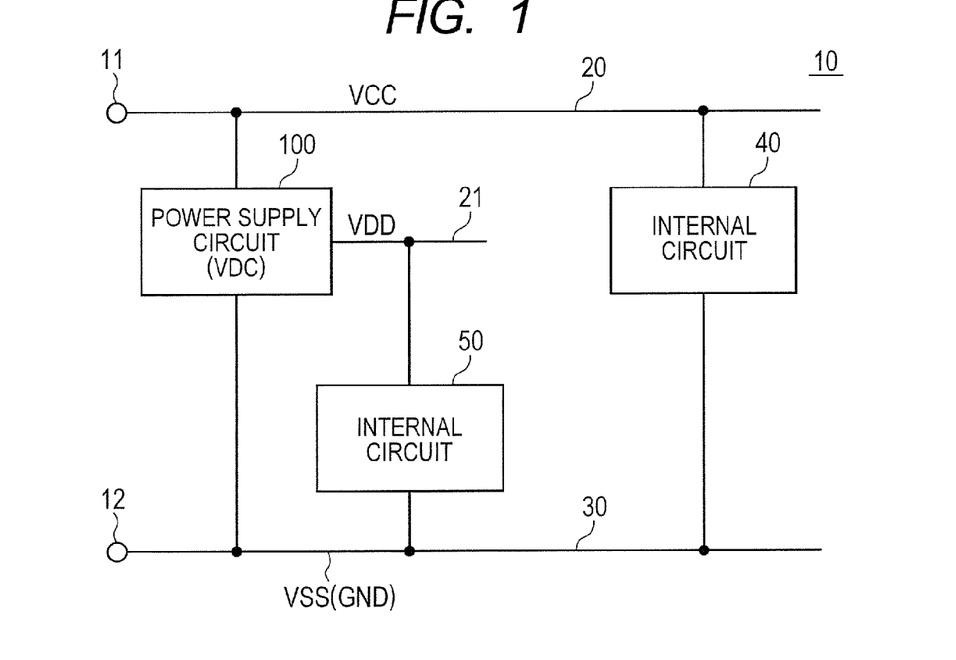
FIG. 1 is a block diagram schematically illustrating the configuration of a semiconductor device according to an embodiment.

FIG. 1 is a block diagram schematically illustrating the configuration of a semiconductor device 10 as an embodiment.

Referring to FIG. 1, the semiconductor device 10 includes an external power supply line 20, an internal power supply line 21, a power supply line 30, internal circuits 40 and 50, and a power supply circuit (VDC: Voltage Down Converter) 100. The external power supply line 20 corresponds to an example of a "first power supply line" and the internal power supply line 21 corresponds to an example of a "second power supply line".

The external power supply line 20 transmits power supply voltage (external power supply voltage) VCC supplied from the outside to a power supply pin 11. The power supply line 30 transmits a DC voltage VSS supplied to a power supply pin 12.

The internal circuit 40 is configured to receive supply of the external power supply voltage VCC and operate. The internal circuit 40 includes, for example, a buffer circuit for a signal input/output (I/O).

The power supply circuit 100 drops the external power supply voltage VCC of the external power supply line 20 and supplies an internal power supply voltage VDD to the internal power supply line 21. The internal circuit 50 receives supply of the internal power supply voltage VDD and operates. For example, in the case where the semiconductor device 10 is a microcomputer, the internal circuit 50 includes a CPU (Central Processing Unit), a RAM (Random Access Memory), a ROM (Read Only Memory), and a peripheral circuit.

The internal power supply voltage VDD has to be controlled by the power supply circuit 100 so as to be a constant value regardless of a change in the external power supply voltage VCC and a change in the environmental temperature. Since the internal power supply voltage VDD is used as a drive voltage of the internal circuit 50, when the internal power supply voltage VDD rises excessively, overvoltage is applied to the internal circuit 50.

The relation of the following equation (1) is satisfied among the external power supply voltage VCC, the internal power supply voltage VDD, and the DC voltage VSS.

$$VCC > VDD > VSS \quad (1)$$

Since the DC voltage VSS transmitted by the power supply line 30 is typically a ground voltage GND, in the following, the power supply line 30 will be also called a ground line 30. When the voltage relation of the equation (1) is satisfied, the DC voltage VSS may be a voltage different from the ground voltage.

Configuration of Power Supply Circuit as Comparative Example

Figure 2:
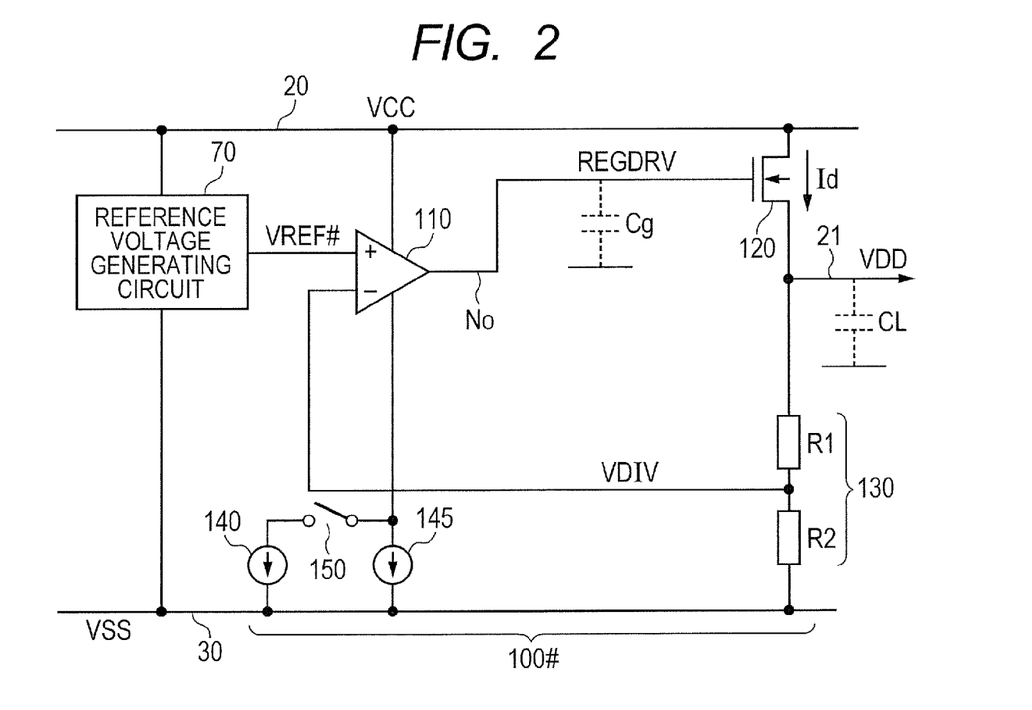
FIG. 2 is a block diagram illustrating an example of the configuration of a power supply circuit as a comparative example.

FIG. 2 is a block diagram for explaining an example of the configuration of a power supply circuit 100# illustrated as a comparative example of the power supply circuit 100 illustrated in FIG. 1. The power supply circuit 100# corresponds to a general VDC which is applied to a semiconductor device.

With reference to FIG. 2, the power supply circuit 100# has an error amplifier 110, a drive transistor 120, a voltage dividing circuit 130, current supplies 140 and 145, and a current supply changing switch 150. In the example of FIG. 2, the drive transistor 120 is an n-type field effect transistor (typically, an NMOS transistor).

The voltage dividing circuit 130 is coupled between the internal power supply line 21 and the ground line 30 and outputs a divided voltage VDIV of the internal power supply voltage VDD. In the example of FIG. 2, the voltage dividing ratio of the voltage dividing circuit 130 is R2/(R1+R2). That is, VDIV=R2/(R1+R2)×VDD.

The reference voltage generating circuit 70 is configured by a known band-gap reference circuit or the like and generates a reference voltage VREF# for the divided voltage VDIV, to control the internal power supply voltage VDD to a predetermined voltage VTAR. The predetermined voltage VTAR is expressed by the following equation (2) using the voltage dividing ratio (R1+R2)/R2 of the voltage dividing circuit 130.

$$VTAR=(R1+R2)/R2 \times VREF\# \quad (2)$$

The error amplifier 110 controls voltage REGDRV of an output node "No" in accordance with the voltage difference between the divided voltage VDIV which is supplied to an inversion input terminal (− input terminal) and the reference voltage VREF# which is supplied to the non-inversion input terminal (+ input terminal).

The drive transistor 120 is coupled between the external power supply line 20 and the internal power supply line 21 and supplies drive current Id according to the voltage of the control electrode (gate) from the external power supply line 20 to the internal power supply line 21. The control electrode (gate) of the drive transistor 120 is coupled to the output node "No" of the error amplifier 110. Therefore, the drive current Id is controlled according to the voltage REGDRV (hereinafter, also called control voltage REGDRV). When the drive transistor 120 is an n-type transistor, as the control voltage REGDRV changes (rises) toward the external power supply voltage VCC, the drive current Id increases. On the other hand, as the control voltage REGDRV changes (drops) toward the ground voltage VSS, the drive current Id decreases.

The internal power supply line 21 has a parasitic capacitance CL of a few nF due to the internal circuit 50 or the like as a load. On the other hand, a parasitic capacitance Cg in the control electrode (gate) of the drive transistor 120 coupled to the output node "No" is a few pF.

When VDIV>VREF#, the error amplifier 110 drives the output node "No" in which the control voltage REGDRV is generated by the DC voltage VSS. Consequently, the drive current Id generated by the drive transistor 120 decreases, so that the internal power supply voltage VDD drops. On the other hand, when VDIV<VREF#, the error amplifier 110 drives the output node "No" by the external power supply voltage VCC. Consequently, the drive current Id generated by the drive transistor 120 increases, so that the internal power supply voltage VDD rises.

In such a manner, the error amplifier 110 performs a feedback control on the control voltage REGDRV (that is, the gate voltage of the drive transistor 120) in accordance with the difference voltage between the internal power supply voltage VDD and the predetermined voltage VTAR on the basis of comparison between the divided voltage VDIV and the reference voltage VREF#. By the feedback control, the internal power supply voltage VDD is controlled to the predetermined voltage VTAR. Although the circuit configuration of the error amplifier 110 is not limited, for example, it can be configured by a current mirror differential amplifier.

The drive speed of the control voltage REGDRV by the error amplifier 110, that is, the change speed of the gate voltage of the drive transistor 120 changes according to the magnitude of the operation current of the error amplifier 110. The error amplifier 110 operates by the currents from the current supplies 140 and 145.

For example, in the normal mode of the semiconductor device 10, by turning on the current supply changing switch 150, the operation current of the error amplifier 110 is supplied from both of the current supplies 140 and 145. Accordingly, while power consumption of the error amplifier 110 increases, the drive speed of the control voltage REGDRV, that is, a change speed of the gate voltage of the drive transistor 120 increases. Consequently, the control speed of the internal power supply voltage VDD increases.

On the other hand, in a low-power-consumption mode such as a standby mode, by turning off the current supply changing switch 150, the operation current of the error amplifier 110 is supplied only by the current supply 145. For example, the current supplied from the current supply 145 is several tens of nA. Accordingly, power consumption of the error amplifier 110 is suppressed and, on the other hand, the change speed of the gate voltage of the drive transistor 120 decreases. That is, the control speed of the internal power, supply voltage VDD decreases.

Figure 3:
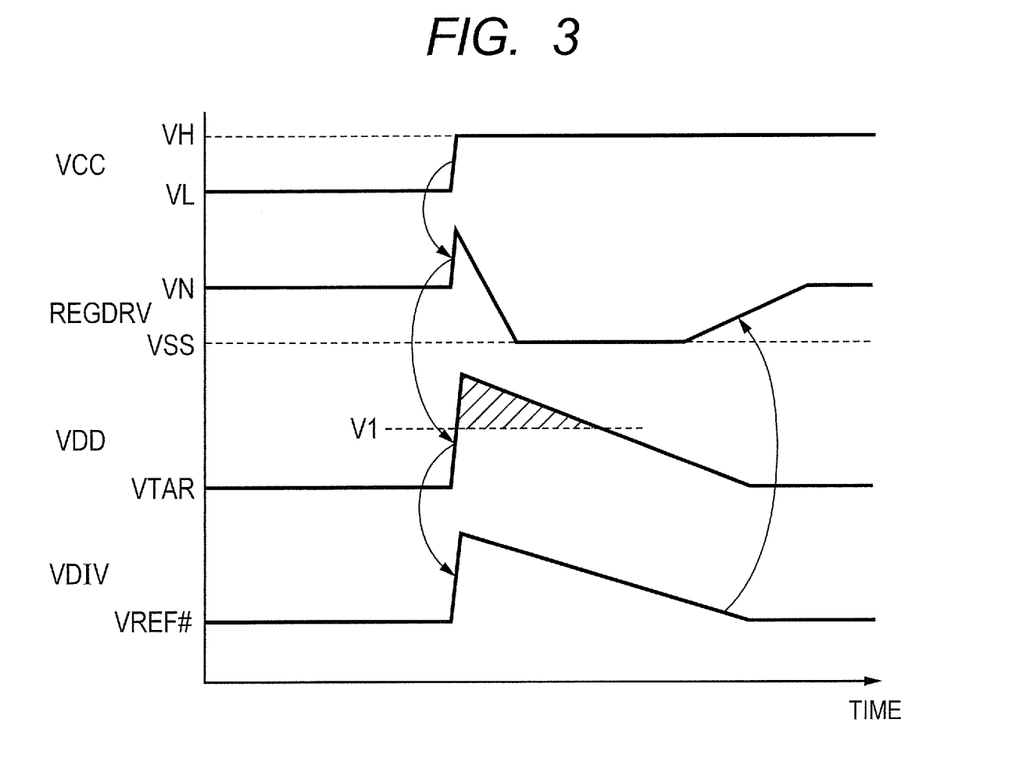
FIG. 3 is a waveform chart for explaining a problem which occurs in the power supply circuit illustrated in FIG. 2.

FIG. 3 is a waveform chart for explaining a problem which occurs in the power supply circuit 100# illustrated as a comparative example in FIG. 2.

FIG. 3 illustrates the behavior of the internal power supply voltage VDD in the case where the external power supply voltage VCC changes from VL (for example, 1.8V) to VH (for example, 3.6V). For example, VL corresponds to the level of the external power supply voltage VCC which is supplied when the semiconductor device 10 is in the low power consumption mode. VH corresponds to a voltage level for operating the internal circuit 40. The external power supply voltage VCC rises from VL to VH by an operation requested to the semiconductor device 10 or an unexpected external factor.

In a period in which VCC is maintained at VL (VCC=VL), the current supply changing switch 150 is turned on, and the operation current to the error amplifier 110 is narrowed. In a state where REGDRV=VN, the divided voltage VDIV is maintained at VREF#. At this time, the internal power supply voltage VDD is controlled to be equal to VTR (VDD=VTAR).

When the external power supply voltage VCC rises from VL to VH, by capacitive coupling between the external power supply line 20 and the output node "No", the control voltage REGDRV at the output node "No" rises from VN.

Since the drive current Id increases accompanying the rise in the control voltage REGDRV, the internal power supply voltage VDD rises. By the rise in the internal power supply voltage VDD, the divided voltage VDIV also rises. Therefore, by feedback control based on the comparison between the divided voltage VDIV and the reference voltage VREF# by the error amplifier 110, the control voltage REGDRV drops toward the DC voltage VSS. Through the feedback control, the risen internal power supply voltage VDD drops again to the predetermined voltage VTAR.

However, in the case where the operation current of the error amplifier 110 is narrowed as described above, the drive speed of the control voltage REGDRV, that is, the change speed of the gate voltage of the drive transistor 120 is suppressed, so that a certain amount of time is required until the internal power supply voltage VDD drops. As a result, as hatched in FIG. 3, the internal power supply voltage VDD becomes equal to or larger than a predetermined voltage V1 for a predetermined period. When the period becomes long, a problem on a withstand voltage may occur in the internal circuit 50 due to application of overvoltage.

First Embodiment

Figure 4:
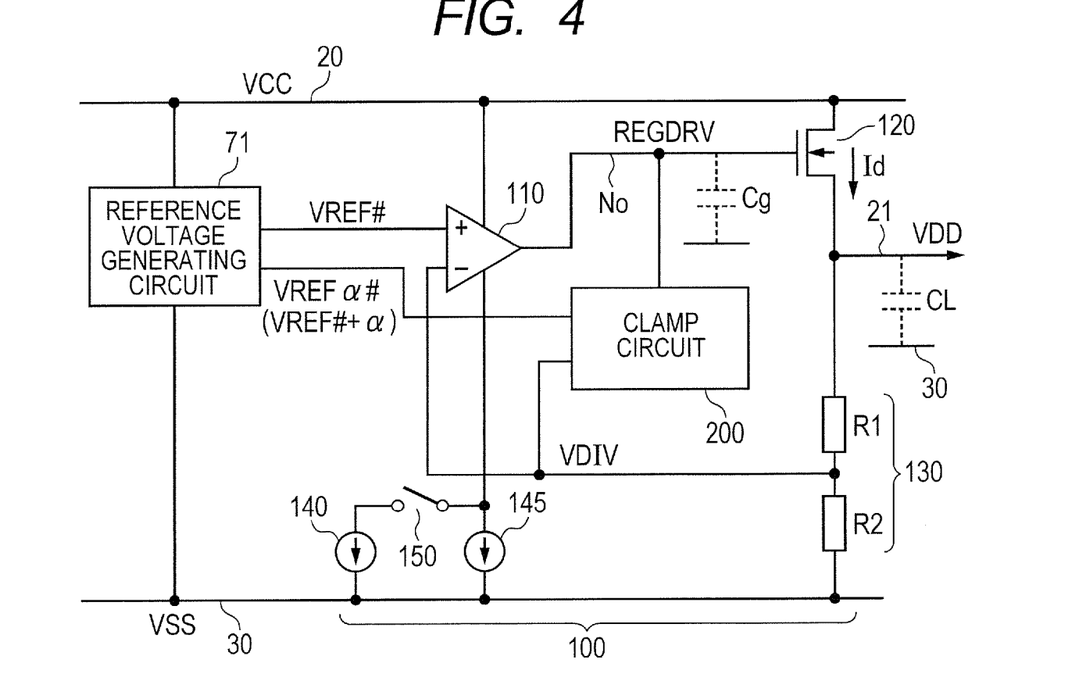
FIG. 4 is a block diagram for explaining an example of the configuration of a power supply circuit according to a first embodiment.

FIG. 4 is a block diagram for explaining an example of the configuration of the power supply circuit 100 according to a first embodiment for use in the semiconductor device 10 illustrated in FIG. 1.

Referring to FIG. 4, the power supply circuit 100 according to the first embodiment is different from the power supply circuit 100# as a comparative example illustrated in FIG. 2 with respect to the point that a clamp circuit 200 is further provided. Further, VREFα# is generated in addition to the reference voltage VREF# by a reference voltage generating circuit 71 provided in place of the reference voltage generating circuit 70 (FIG. 2). VREFα# is a voltage higher than VREF# only by a predetermined voltage α.

The clamp circuit 200 receives the divided voltage VDIV from the voltage dividing circuit 130 and the reference voltage VREFα# from the reference voltage generating circuit 71. The clamp circuit 200 is configured to change the control voltage REGDRV of the output node "No" toward the DC voltage VSS when the divided voltage VDIV exceeds the reference voltage VREFα#. Since the configuration of the other part of the power supply circuit 100 is similar to that of the power supply circuit 100# as a comparative example, its detailed description will not be repeated.

Figure 5:
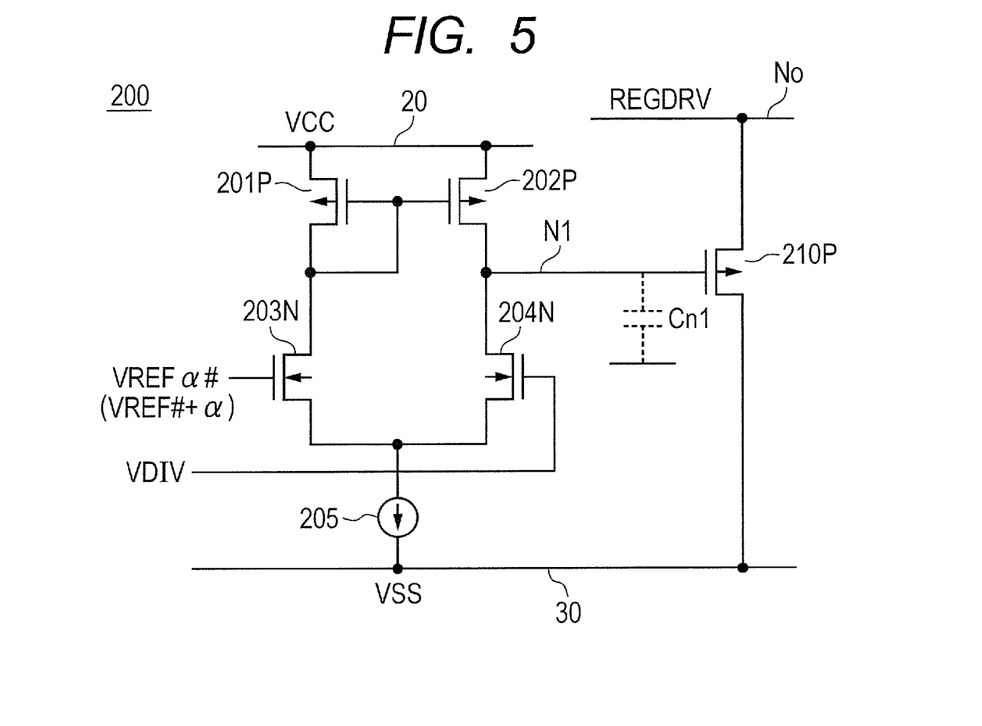
FIG. 5 is a circuit diagram illustrating an example of the configuration of a clamp circuit shown in FIG. 4.

FIG. 5 is a circuit diagram illustrating an example of the configuration of the clamp circuit 200 shown in FIG. 4. Referring to FIG. 5, the clamp circuit 200 has field effect transistors (typically, MOS transistors) 201P, 202P, 203N, and 204N configuring a current mirror differential amplifier, a current supply 205 for supplying operation current of the current mirror differential amplifier, and a transistor 210P for clamping. The current mirror differential amplifier corresponds to an embodiment of a "differential amplifier" of the clamp circuit.

In the configuration example of FIG. 5, the transistor 210P for clamping is a p-type field effect transistor (PMOS transistor). The PMOS transistor 210P is electrically coupled between the output node "No" outputting the control voltage REGDRV and the ground line 30. The gate of the PMOS transistor 210P is electrically coupled to an output node N1 of the current mirror differential amplifier. The PMOS transistor 210P is shown as an embodiment of a "clamp element".

The clamp circuit 200 operates when the transistor 210P for clamping is conducted to electrically couple the output node "No" to the ground line 30 supplying the ground voltage VSS. Consequently, the output node "No" is driven by the ground voltage VSS. On the other hand, the clamp circuit 200 does not operate when the transistor 210P for clamping is non-conductive.

The PMOS transistors 201P and 202P configure a pair of load transistors, and the NMOS transistors 203N and 204N receiving the reference voltage VREFα# and the divided voltage VDIV by their gates, respectively, configure a differential pair of transistors.

The current mirror differential amplifier drives the output node N1 by the ground voltage VSS when VDIV>VREFα# (VDD>VTARα). It makes the transistor 210P for clamping conducted, so that the control voltage REGDRV of the output node "No", that is, the gate voltage of the drive transistor 120 changes (drops) toward the ground voltage VSS. Consequently, when VDIV>VREFα# is satisfied, that is, when the internal power supply voltage VDD exceeds the predetermined voltage VTARα, by the operation of the clamp circuit 200, the drive current Id of the n-type drive transistor 120 can be promptly decreased. In particular, by setting REGDRV=VSS, the drive current Id is cut. The predetermined voltage VTARα for the internal power supply voltage VDD is expressed by the following equation (3) using VREFα# for the divided voltage VDIV.

$$VTAR\alpha = (R1+R2)/R2 \times VREF\alpha\# \quad (3)$$

On the other hand, when VDIV<VREFα# (VDD<VTARα), the output node N1 of the current mirror differential amplifier is driven by the external power supply voltage VCC. Therefore, the transistor 210P for clamping is made non-conductive, so that the clamp circuit 200 does not operate. That is, the control voltage REGDRV is determined by the output voltage of the error amplifier 110.

Since the parasitic capacitance (Cg in FIG. 4) of the output node "No" driven by the transistor 210P for clamping is relatively small (a few pF), the aspect ratio (W/L) of the transistor 210P for clamping can be lowered. For example, the aspect ratio of the transistor 210P for clamping may be part of hundreds of that of the drive transistor 120.

As a result, a parasitic capacitance Cn1 hanging on the output node N1 coupled to the gate of the transistor 210P for clamping also decreases (for example, almost equal to Cg). Consequently, the clamp circuit 200 can operate at high speed by small operation current (current from the current supply 205).

Figure 6:
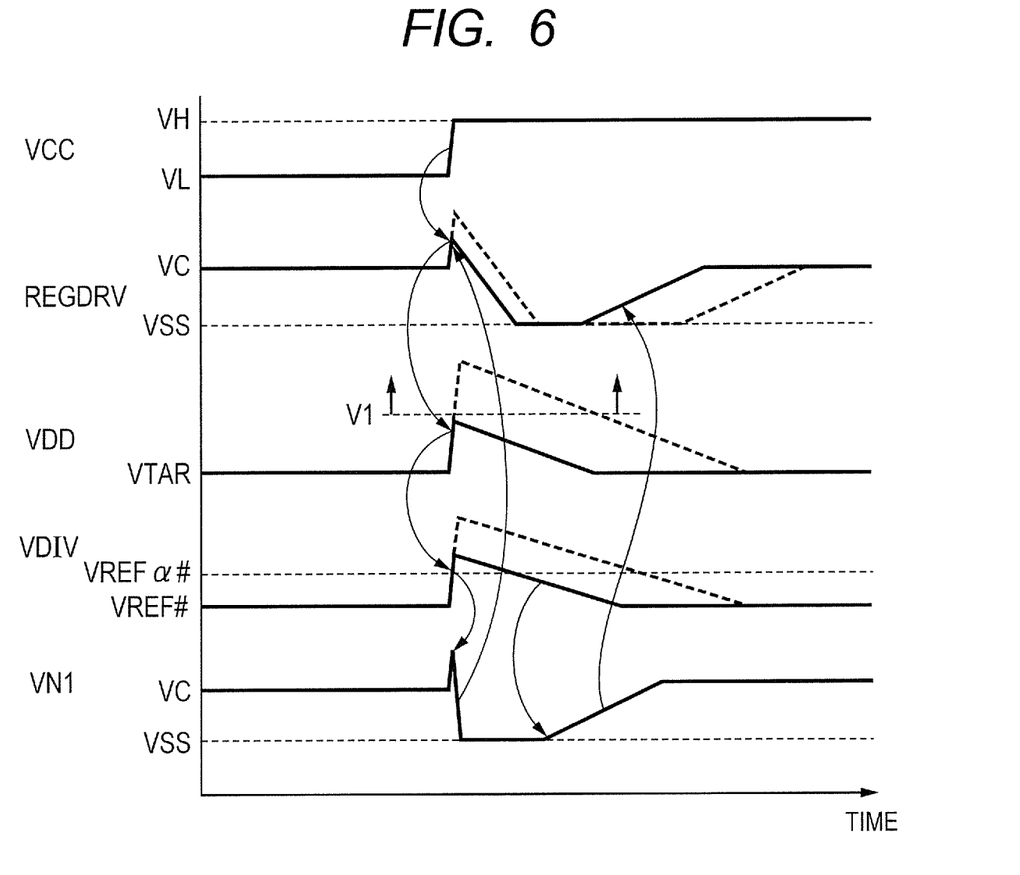
FIG. 6 is a waveform chart for explaining the operation of the power supply circuit according to the first embodiment.

FIG. 6 is a waveform chart for explaining the operation of the power supply circuit 100 according to the first embodiment. FIG. 6 illustrates operation waveforms of the power supply circuit 100 in the case where a fluctuation in the external power supply voltage VCC similar to that in FIG. 3 occurs. In FIG. 6, operation waveforms (FIG. 4) of the power supply circuit 100# as a comparative example are illustrated by dotted lines for comparison.

In FIG. 6, the waveform of the voltage VN1 of the output node N1 of the current mirror differential amplifier in the clamp circuit 200 is also illustrated. In the period of VCC=VL, VDD is maintained to be equal to VTAR (VDIV=VREF#), so that the voltage VN1 has a constant value.

Referring to FIG. 6, in a manner similar to the case of FIG. 3, after the period in which VCC is maintained to be equal to VL, the external power supply voltage VCC rises from VL to VH. In association with the rise, the control voltage REGDRV on the output node "No" rises from VC (corresponding to VN in FIG. 3), so that the internal power supply voltage VDD rises by increase in the drive current Id. The voltage VN1 on the output node N1 also rises like the voltage on the output node "No".

However, when the divided voltage VDIV becomes higher than the reference voltage VREFα# due to the rise in the internal power supply voltage VDD, in the clamp circuit 200, the current mirror amplifier drives the output node N1 by the ground voltage VSS. As a result, the voltage VN1 changes to the ground voltage VSS, and the transistor 210P for clamping is conducted, so that the clamp circuit 200 operates.

In such a manner, the control voltage REGDRV can be changed (dropped) toward the ground voltage VSS so that the drive current Id of the drive transistor 120 decreases. Consequently, the rise of the internal power supply voltage VDD is stopped earlier than the feedback control by the error amplifier 110, indicated by the broken lines.

In the following, the control voltage REGDRV (gate voltage of the drive transistor 120) is decreased by the operation of the clamp circuit 200 in the period of VDIV>VREFα# and feedback control of the error amplifier 110, thereby promptly solving the rise in the internal power supply voltage VDD.

Particularly, since the clamp circuit 200 directly drives the voltage on the output node "No", it can be expected that the control voltage REGDRV is changed more promptly as compared with the case of increasing the operation current of the error amplifier 110.

Further, by properly setting an addition voltage α specifying the reference voltage VREFα# in accordance with a permissible amount of overshoot in the internal power supply voltage VDD, the internal power supply voltage VDD can be controlled so that the period where VDD>V1 illustrated in FIG. 3 is not generated. For example, proper value of the addition voltage α can be determined in advance by a preliminary real-machine experiment or circuit simulation.

Figure 7:
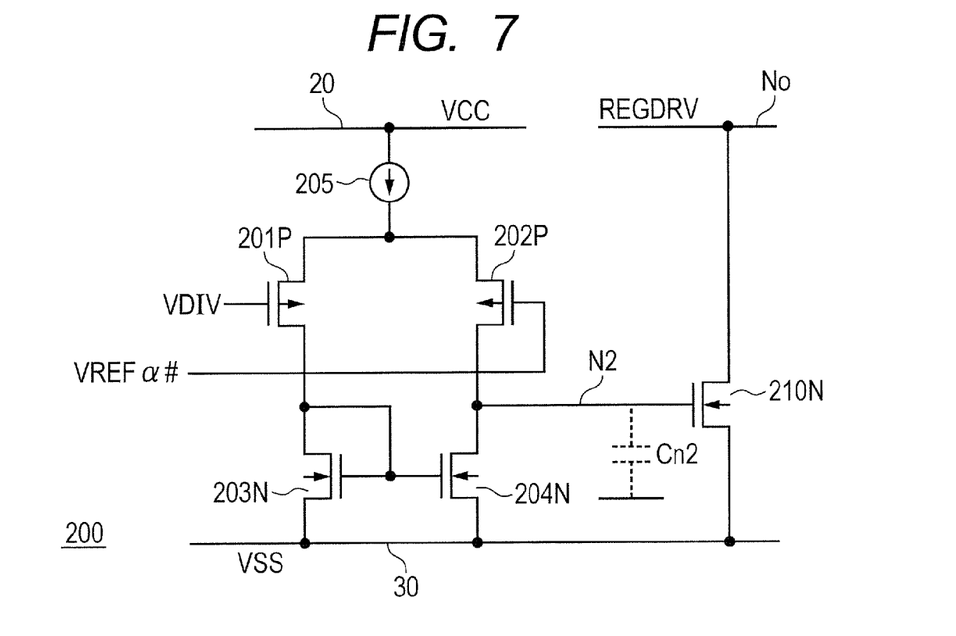
FIG. 7 is a circuit diagram illustrating a modification of the configuration of the clamp circuit.

FIG. 7 illustrates a modification of the configuration of the clamp circuit 200.

Referring to FIG. 7, the clamp circuit 200 has the transistors 201P, 202P, 203N, and 204N configuring a current mirror differential amplifier, the current supply 205, and the transistor 210N for clamping. The modification of FIG. 7 is different from the configuration example of FIG. 5 with respect to the point that the transistor for clamping is an NMOS transistor. The transistor 210N for clamping is, like the transistor 210P for clamping (FIG. 5), electrically coupled between the output node "No" outputting the control voltage REGDRV and the ground line 30. The gate of the transistor 210N for clamping is electrically coupled to an output node N2 of the current mirror differential amplifier. The NMOS transistor 210N is shown as an embodiment of a "clamp element".

The current mirror differential amplifier is configured so that the voltage polarity becomes opposite to that in the configuration example of FIG. 4. Concretely, the NMOS transistors 203N and 204N configure a pair of load transistors, and the PMOS transistors 201P and 202P receiving the divided voltage VDIV and the reference voltage VREFα#, respectively, by their gates configure a differential pair of transistors.

Therefore, the current mirror differential amplifier illustrated in FIG. 7 drives the output node N2 by the external power supply voltage VCC when VDIV>VREFα#. It makes the transistor 210N for clamping conducted, so that the output node "No" is electrically coupled to the ground line 30. As a result, the control voltage REGDRV, that is, the gate voltage of the drive transistor 120 changes (drops) toward the ground voltage VSS. Consequently, when VDIV>VREFα# is satisfied, that is, when the internal power supply voltage VDD exceeds the predetermined voltage VTARα, by the operation of the clamp circuit 200, the drive current Id of the n-type drive transistor 120 can be promptly decreased. By setting REGDRV=VSS, the drive current Id is cut.

On the other hand, when VDIV<VREFα# (VDD<VTARα), in a manner similar to the configuration example of FIG. 5, the clamp circuit 200 does not operate for the following reason. Since the current mirror differential amplifier drives the output node N2 by the ground voltage VSS, the transistor 210N for clamping is made nonconductive.

As described above, also by the configuration example of FIG. 7, the clamp circuit 200 displaying functions similar to those of the configuration example of FIG. 5 can be realized. If the function of changing the gate voltage of the drive transistor 120 in the direction of decreasing the drive current Id in accordance with VDIV>VREFα# (that is, VDD>VTARα) is realized, another circuit configuration can be also applied.

As described above, in the power supply circuit 100 according to the first embodiment, by disposing the clamp circuit 200, rise in the internal power supply voltage VDD accompanying the change (rise) in the gate voltage of the drive transistor 120 can be promptly solved. Consequently, representatively, also in the case where the internal power supply voltage VDD rises accompanying the rise in the external power supply voltage VCC, the voltage rise amount can be suppressed. As a result, occurrence of a problem regarding a withstand voltage in a circuit group (the internal circuit 50 in FIG. 1) receiving the supply of the internal power supply voltage VDD can be prevented.

In particular, the operation of the clamp circuit 200 is a simple operation of changing the voltage of the control electrode (gate) of the drive transistor in a single direction (the direction of decreasing the drive current), so that the possibility of exerting an influence on an original feedback control system by the error amplifier 110 is low. The configuration of the clamp circuit 200 is also relatively simple.

Therefore, by the power supply circuit according to the first embodiment, by simply adding the clamp circuit to the circuit configuration of a general VDC, without complicating the circuit configuration and control, occurrence of overvoltage due to excessive rise in the internal power supply voltage VDD can be effectively prevented.

Second Embodiment

In the first embodiment, the example of using the n-type field effect transistor as the drive transistor of the power supply circuit has been described. In a second embodiment, an example of using a p-type field effect transistor as the drive transistor will be described.

Figure 8:
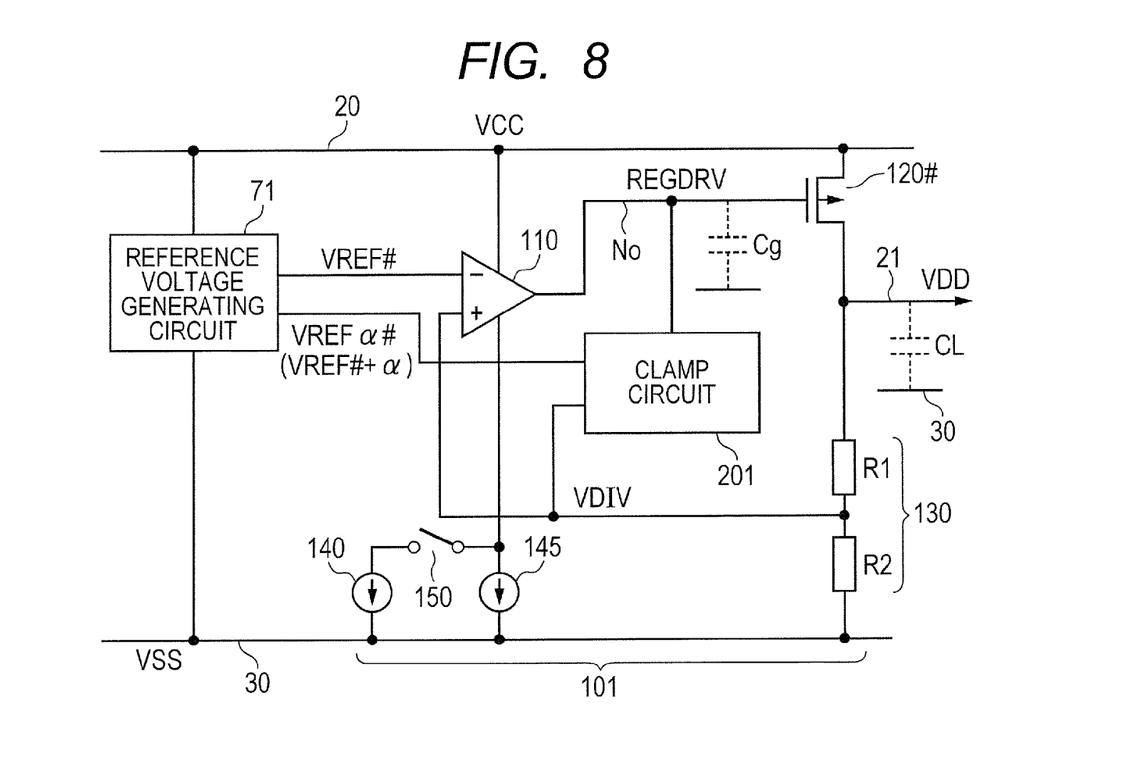
FIG. 8 is a block diagram for explaining an example of the configuration of a power supply circuit according to a second embodiment.

FIG. 8 is a block diagram illustrating an example of the configuration of a power supply circuit 101 according to the second embodiment. The power supply circuit 101 illustrated in FIG. 8 can be used like the power supply circuit 100 in the semiconductor device 10 illustrated in FIG. 1.

Referring to FIG. 8, the power supply circuit 101 is different from the power supply circuit 100 illustrated in FIG. 4 with respect to the points that a drive transistor 120# configured by a p-type field effect transistor (PMOS transistor) is included in place of the (n-type) drive transistor 120, and a clamp circuit 201 is included in place of the clamp circuit 200.

In the error amplifier 110, a reference voltage VREF# is supplied to an inversion input terminal (− input terminal) and, on the other hand, the divided voltage VDIV is supplied to a non-inversion input terminal (+ input terminal). Since the configuration of the other part of the power supply circuit 101 is similar to that of the power supply circuit 100 illustrated in FIG. 4, the detailed description will not be repeated.

In the power supply circuit 101, the error amplifier 110 drives the output node "No" by the external power supply voltage VCC when VDIV>VREF# (that is, VDD>VTAR). On the other hand, the error amplifier 110 drives the output node "No" by the ground voltage VSS when VDIV<VREF# (that is, VDD<VTAR).

The control electrode (gate) of the drive transistor 120# is coupled to the output node "No" of the error amplifier 110. The drive current Id of the drive transistor 120# increases as the control voltage REGDRV of the output node "No" changes (decreases) toward the ground voltage VSS whereas it decreases as the control voltage REGDRV changes (increases) toward the external power supply voltage VCC.

Therefore, when VDIV>VREF# (that is, VDD>VTAR), the drive current Id decreases. On the other hand, when VDIV<VREF# (that is, VDD<VTAR), the drive current Id increases. That is, a feedback control by the error amplifier 110 similar to that in the power supply circuit 100 in the first embodiment is executed.

Figure 9:
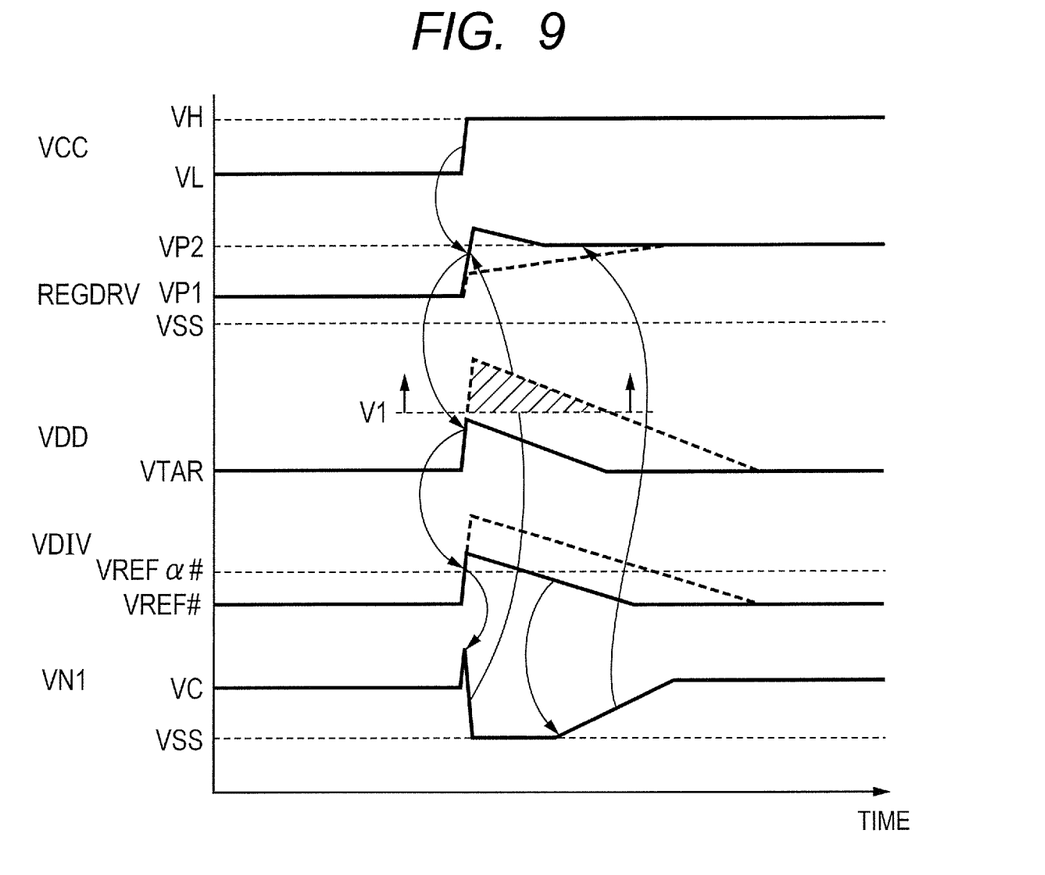
FIG. 9 is a waveform chart for explaining the operation of the power supply circuit according to the second embodiment.

FIG. 9 is a waveform chart for explaining the operation of the power supply circuit 101 according to the second embodiment.

In FIG. 9, operation waveforms in a power supply device obtained by eliminating the clamp circuit 201 from the power supply circuit 101 in FIG. 8, that is, operation waveforms in the case of using a p-type field effect transistor as the drive transistor 120 in the power supply circuit 100# as the comparative example illustrated in FIG. 2 are shown by dotted lines.

FIG. 9 illustrates operation waveforms in the case where the external power supply voltage VCC changes from VL to VH like in FIGS. 3 and 6.

In the period in which VCC=VL is maintained, the current supply changing switch 150 is turned on to narrow the operation current to the error amplifier 110. By feedback control of the error amplifier 110, the divided voltage VDIV is maintained to be equal to VREF# in a state where REGDRV=VP1. At this time, the internal power supply voltage VDD is controlled to be equal to VTAR.

When the external power supply voltage VCC rises from VL to VH, in the case where the drive transistor is a PMOS transistor, when the gate voltage is constant, the drive current Id increases by rise in the gate-source voltage. With the rise in the external power supply voltage VCC, the control voltage REGDRV on the output node "No" rises from VP1 by capacitive coupling between the external power supply line 20 and the output node "No". When the voltage rise amount matches (VH-VL), increase in the drive current Id does not occur.

However, in the case where the voltage rise amount of the control voltage REGDRV is small as illustrated by the dotted lines in the diagram, the internal power supply voltage VDD rises due to the increase in the drive current Id. When the internal power supply voltage VDD rises, the divided voltage VDIV also rises. Consequently, the control voltage REGDRV rises to decrease the drive current Id by the feedback control of the error amplifier 110. Through the feedback control, the risen internal power supply voltage VDD decreases again to the predetermined voltage VTAR in a state where REGDRV=VP2.

In the case where the operation current of the error amplifier 110 is narrowed, a certain amount of time is required until the internal power supply voltage VDD decreases. As a result, in a manner similar to the case described with reference to FIG. 3, the overvoltage that the internal power supply voltage VDD is equal to or larger than the predetermined voltage V1 may occur for a predetermined period (refer to a hatched part in FIG. 9).

Therefore, in the power supply circuit 101 having the p-type drive transistor, when the internal power supply voltage VDD rises, the clamp circuit 201 has to operate to change (increase) the control voltage REGDRV toward the external power supply voltage VCC.

Figure 10:
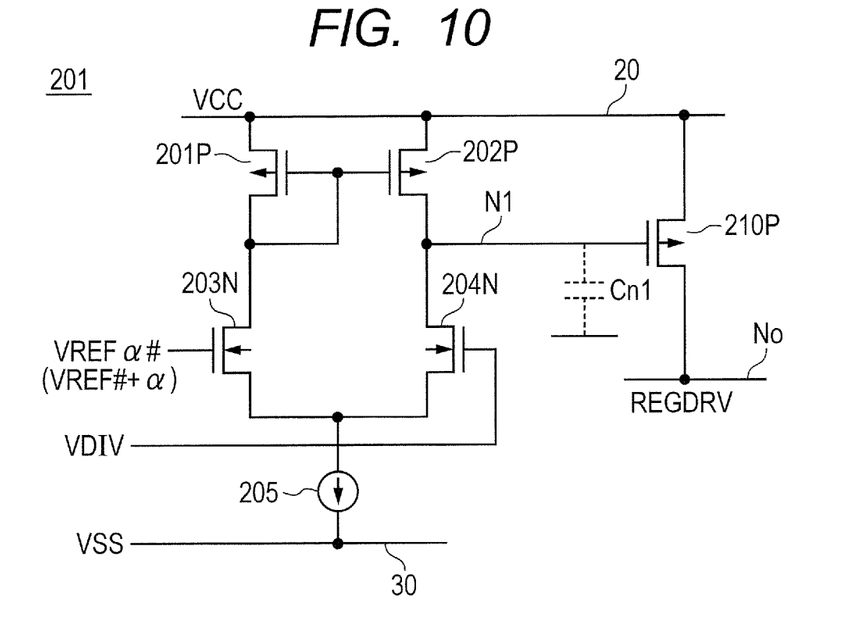
FIG. 10 is a circuit diagram illustrating a first configuration example of the clamp circuit shown in FIG. 8.

FIG. 10 is a circuit diagram illustrating a first configuration example of the clamp circuit 201 shown in FIG. 8.

Referring to FIG. 10, the clamp circuit 201 has the field effect transistors (MOS transistors) 201P, 202P, 203N, and 204N configuring a current mirror differential amplifier, the current supply 205 for supplying operation current of the current mirror differential amplifier, and the transistor (PMOS transistor) 210P for clamping.

The transistor 210P for clamping is electrically coupled between the output node "No" outputting the control voltage REGDRV and the external power supply line 20. The gate of the transistor 210P for clamping is electrically coupled to the output node N1 of the current mirror differential amplifier. Since the configuration of the current mirror differential amplifier is similar to that of FIG. 5, the detailed description will not be repeated.

The clamp circuit 201 operates when the transistor 210P for clamping is conducted to electrically couple the output node "No" to the external power supply line 20. Consequently, the control voltage REGDRV changes toward the external power supply voltage VCC, that is, in the direction that the drive current Id decreases. In particular, when REGDRV becomes equal to VCC, the drive current Id is cut.

On the other hand, the clamp circuit 201 does not operate when the transistor 210P for clamping is not conducted.

Therefore, the clamp 201 operates when VDIV>VREFα# (VDD>VTARα) and increases the gate voltage of the p-type drive transistor 120#, thereby enabling the drive current Id to be promptly decreased.

Figure 11:
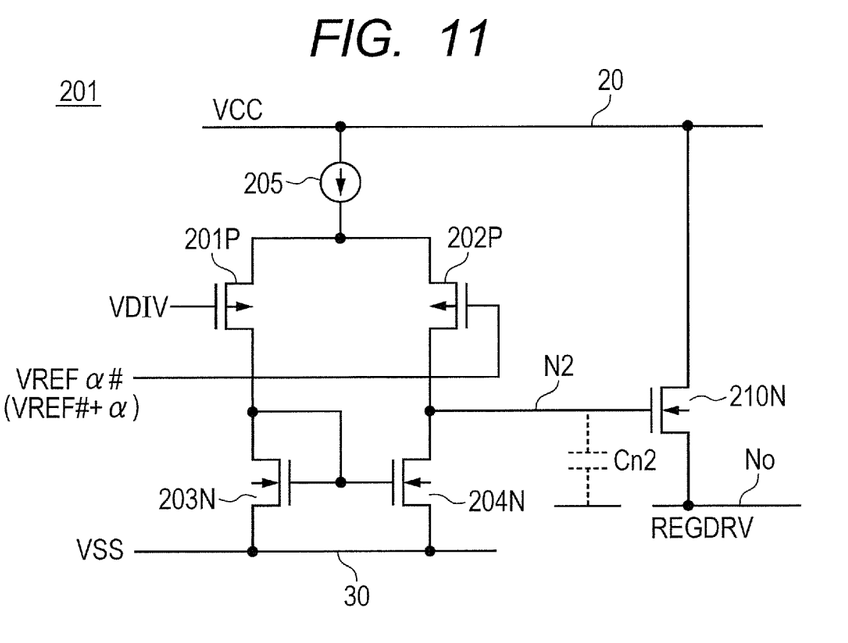
FIG. 11 is a circuit diagram illustrating a second configuration example of the clamp circuit shown in FIG. 8.

FIG. 11 illustrates a second configuration example of the clamp circuit 201 shown in FIG. 8.

Referring to FIG. 11, the clamp circuit 201 has the field effect transistors (MOS transistors) 201P, 202P, 203N, and 204N configuring a current mirror differential amplifier, the current supply 205 for supplying operation current of the current mirror differential amplifier, and the transistor (NMOS transistor) 210N for clamping.

The transistor 210N for clamping is an n-type field effect transistor (NMOS transistor) and is electrically coupled between the output node "No" outputting the control voltage REGDRV and the external power supply line 20. The gate of the transistor 210N for clamping is electrically coupled to the output node N2 of the current mirror differential amplifier. Since the configuration of the current mirror differential amplifier is similar to that of FIG. 7, the detailed description will not be repeated.

The clamp circuit 201 operates when the transistor 210N for clamping is conducted to electrically couple the output node "No" to the external power supply line 20. Consequently, the control voltage REGDRV changes toward the external power supply voltage VCC, that is, in the direction that the drive current Id decreases. In particular, when REGDRV becomes equal to VCC, the drive current Id is cut. On the other hand, the clamp circuit 201 does not operate when the transistor 210N for clamping is not conducted.

Therefore, also by the clamp circuit 201 illustrated in FIG. 11, like in the clamp circuit illustrated in FIG. 10, the drive current Id can be promptly decreased when VDIV>VREFα# (VDD>VTARα).

Referring again to FIG. 9, in the power supply circuit 101, when the divided voltage VDIV becomes higher than the reference voltage VREFα# due to the rise in the internal power supply voltage VDD as the operation waveform illustrated by the solid line, in the clamp circuit 201 (FIG. 10), the current mirror amplifier drives the output node N1 by the ground voltage VSS. As a result, the voltage VN1 changes to the ground voltage VSS, so that the transistor 210P for clamping is conducted, and the clamp circuit 201 operates.

Consequently, the control voltage REGDRV can be changed (decreased) toward the ground voltage VSS so that the drive current Id of the drive transistor 120 decreases. As a result, the rise in the internal power supply voltage VDD can be stopped earlier than the feedback control of the error amplifier 110 shown by the dotted line.

In the following, by the operation of the clamp circuit 201 in the period of VDIV>VREFα# and the feedback control of the error amplifier 110, finally, by stabilizing the control voltage REGDRV equal to VP2, the internal power supply voltage VDD is controlled to the predetermined voltage VTAR. Thus, rise in the internal power supply voltage VDD can be promptly solved.

As described above, also by the power supply circuit 101 of the second embodiment, like in the power supply circuit 100 of the first embodiment, the rise in the internal power supply voltage VDD accompanying the rise in the external power supply voltage VCC can be promptly solved. Consequently, occurrence of a problem regarding a withstand voltage in a circuit group (the internal circuit 50 in FIG. 1) receiving the supply of the internal power supply voltage VDD can be prevented.

That is, regardless of the type (p-type or n-type) of the drive transistor of the power supply device (VDC), by application of the embodiment, without complicating the circuit configuration and control, occurrence of overvoltage due to excessive rise in the internal power supply voltage VDD can be effectively prevented. The addition voltage α specifying the reference voltage VREFα# which controls the operation of the clamp circuit 201 changes according to the characteristics of the drive transistors 120 and 120# and the permissible amount of overshoot of the internal power supply voltage VDD. As described above, the proper value of the addition voltage α can be determined in advance by a preliminary real-machine experiment or circuit simulation.

Although the present invention achieved by the inventors herein has been concretely described on the basis of the embodiments, obviously, the invention is not limited to the foregoing embodiments but can be variously modified without departing from the gist of the invention.

What is claimed is:

1. A semiconductor device, comprising:
   a first power supply line receiving supply of a first DC voltage;
   a second power supply line for transmitting a second DC voltage lower than the first DC voltage;
   a drive transistor, coupled between the first and second power supply lines, which supplies a drive current from the first power supply line to the second power supply line based on a voltage of a control electrode;
   an error amplifier, including an output node coupled to the control electrode of the drive transistor, which changes the voltage of the control electrode toward first voltage which increases the drive current or a second voltage which decreases the drive current based on a difference voltage between a reference voltage and the second DC voltage; and
   a clamp circuit coupled between the output node of the error amplifier and the control electrode of the drive transistor,
   wherein, when the second DC voltage exceeds a predetermined voltage higher than the reference voltage, the clamp circuit changes the voltage of the control electrode toward the second voltage which decreases the drive current, and
   wherein, when the second DC voltage does not exceed the predetermined voltage, the clamp circuit does not change the voltage of the control electrode.

2. The semiconductor device according to claim 1, wherein the drive transistor is an n-type field effect transistor, and
   wherein when the second DC voltage exceeds the predetermined voltage, the clamp circuit decreases the voltage of the control electrode.

3. The semiconductor device according to claim 1, wherein the drive transistor is a p-type field effect transistor, and
   wherein when the second DC voltage exceeds the predetermined voltage, the clamp circuit increases the voltage of the control electrode.

4. A semiconductor device, comprising:
   a first power supply line receiving supply of a first DC voltage;
   a second power supply line for transmitting a second DC voltage lower than the first DC voltage;
   a drive transistor, coupled between the first and second power supply lines, which supplies a drive current from the first power supply line to the second power supply line based on a voltage of a control electrode;

an error amplifier, including an output node coupled to the control electrode of the drive transistor, which changes the voltage of the control electrode toward a first voltage which increases the drive current or a second voltage which decreases the drive current based on a difference voltage between a reference voltage and the second DC voltage; and a clamp circuit, including:
- a differential amplifier outputting a voltage obtained by amplifying a difference voltage between a predetermined voltage higher than the reference voltage and the second DC voltage; and
- a clamp element, electrically coupled between the output node of the error amplifier and the control electrode of the drive transistor, wherein, when the second DC voltage exceeds the predetermined voltage, the clamp element electrically couples the control electrode with the output node of the error amplifier based on the output voltage of the differential amplifier.

5. The semiconductor device according to claim 4, wherein the drive transistor is an n-type field effect transistor, and wherein when the second DC voltage exceeds the predetermined voltage, the clamp circuit decreases the voltage of the control electrode.

6. The semiconductor device according to claim 4, wherein the drive transistor is a p-type field effect transistor, and wherein when the second DC voltage exceeds the predetermined voltage, the clamp circuit increases the voltage of the control electrode.

\* \* \* \* \*